United States Patent [19]
DiBene, II

[11] Patent Number: 5,972,231
[45] Date of Patent: Oct. 26, 1999

[54] IMBEDDED PCB AC COUPLING CAPACITORS FOR HIGH DATA RATE SIGNAL TRANSFER

[75] Inventor: Joseph T. DiBene, II, Oceanside, Calif.

[73] Assignee: NCR Corporation, Dayton, Ohio

[21] Appl. No.: 08/962,065

[22] Filed: Oct. 31, 1997

[51] Int. Cl.[6] .................................................. B44C 1/22
[52] U.S. Cl. ................................. 216/6; 216/13; 216/20; 216/33; 361/763
[58] Field of Search .................................. 216/6, 13, 20, 216/33, 78, 105; 361/734, 763, 766, 821, 830

[56] References Cited

U.S. PATENT DOCUMENTS 5,197,170  3/1993  Senda et al. ............................ 216/6 X
5,486,277  1/1996  Barbee et al. .......................... 216/6 X

*Primary Examiner*—William Powell
*Attorney, Agent, or Firm*—Gates & Cooper

[57] ABSTRACT

A method and apparatus for coupling high speed data components using imbedded PCB AC coupling capacitors is disclosed. The capacitor comprises a first and a second conductive plate of polygonal shape coupled to surrounding circuitry at the polygonal vertices of the polygonal plates. This configuration results in improved capacitor performance, particularly with respect to capacitive impedance and reflected waves for high bandwidth signals at the frequency ranges of interest.

23 Claims, 8 Drawing Sheets

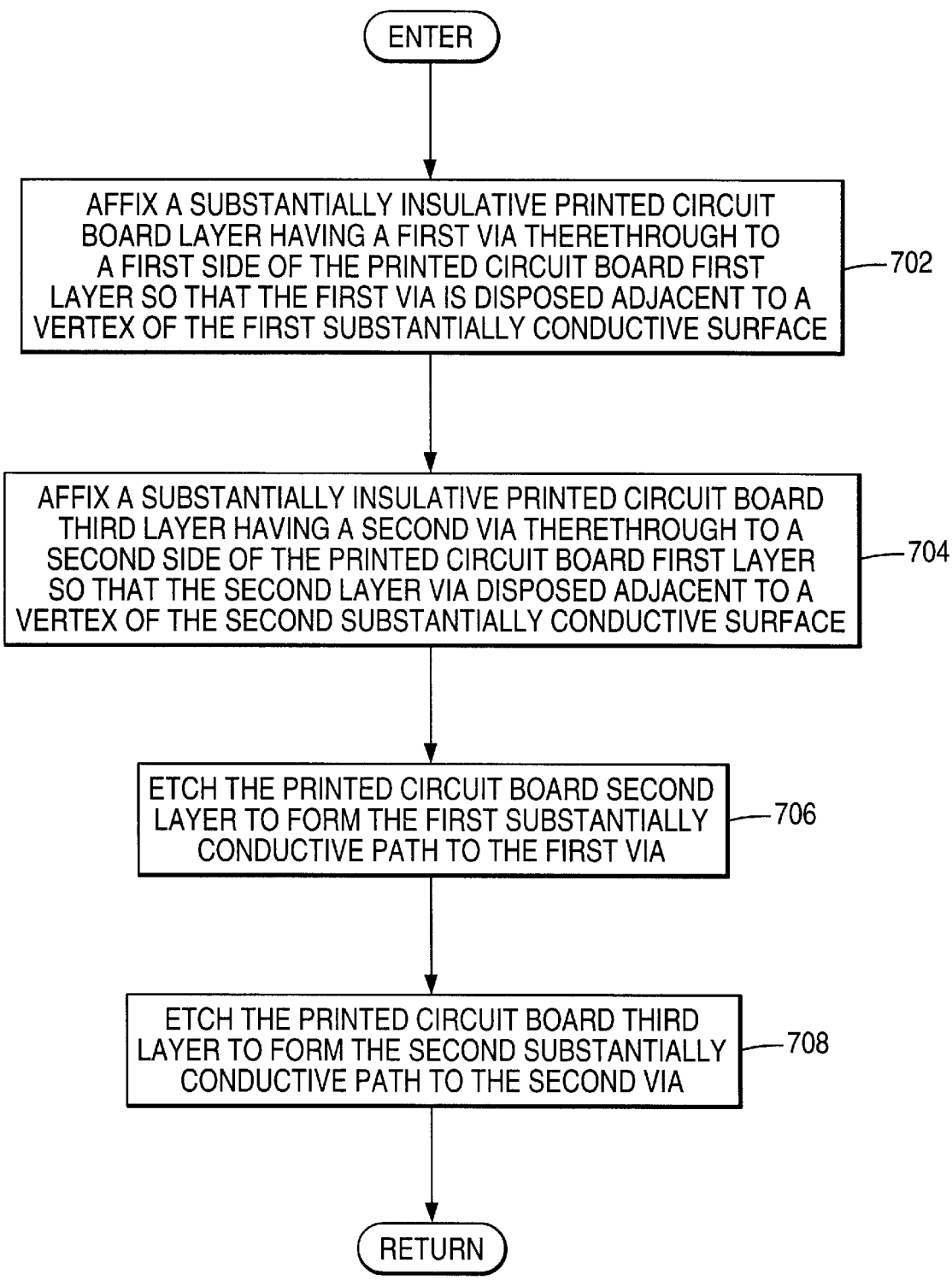

IMBEDDED PCB AC COUPLING CAPACITORS FOR HIGH DATA RATE SIGNAL TRANSFER

BACKGROUND OF THE INVENTION

1. Field of Invention

The present invention relates generally to methods for coupling high speed data components and particularly to a method and apparatus for coupling high speed data components using imbedded PCB AC coupling capacitors.

2. Description of Related Art

Transmitting signals between emitter coupled logic (ECL) circuits that have different bias levels (such as 3.3 and 5 volts, respectively) typically requires alternating current (AC) coupling to isolate direct current (DC) components of the transferred signal. AC coupling can be achieved with a coupling transformer or one or more series capacitors. In either case, the addition of these components can be problematic. Transformers are relatively expensive and large, and at times, difficult to mount to printed circuit boards (PCBs). Separate discrete component capacitors are often smaller than transformers, but not small enough to avoid the routing and layout problems inherent in the typically densely populated PCBs. AC coupling capacitors must be designed such that the impedance of the capacitor is sufficiently low at the frequency of interest to pass the desired signal through substantially unattenuated. These problems are further exacerbated when the signals sought to be transmitted using the FCL circuitry are high bandwidth signals such as those in the order of 100 MHz or more, such as NRZ 8B/10B encoded serial Fibre-channel data, whose lowest switching frequency is about 106 MHz, with the resulting edge rate harmonics around 2 GHz. At such frequencies, current flow across the capacitor plates can result in substantial impedance distortions, reflecting waves, and other undesirable non-linearities.

SUMMARY OF THE INVENTION

There is therefore a need for compact capacitors which take up little space and can be easily implemented on PCBs without creating routing and layout problems and are suitable for high bandwidth signals. In accordance with the present invention, a capacitor implemented on a PCB is disclosed which satisfies this need. The capacitor comprises a substantially insulative printed circuit board first layer having a first side and a second side, a first substantially conductive surface disposed on the first side of the substantially insulative printed circuit board first layer, and a second substantially conductive surface substantially oppositionally disposed from the first substantially conductive surface on the second side of the substantially insulative printed circuit board first layer. The present invention also discloses a method of producing the PCB capacitor, comprising the steps of etching a first substantially conductive surface of trapezoidal shape on a first side of a substantially insulative printed circuit board, etching a second substantially conductive surface of trapezoidal shape on a second side of the substantially insulative printed circuit board, and electrically coupling a first substantially conductive path to a vertex of the first substantially conductive surface and a second substantially conductive path to a vertex of the second substantially conductive surface.

BRIEF DESCRIPTION OF THE DRAWINGS

Throughout the following, reference numerals will be used in the drawings, and like reference numerals will be used throughout the several views in the description to describe corresponding parts of embodiments of the invention.

FIG. 9 is a flow chart illustrating representative method steps used in an embodiment of the present invention to couple the conductive paths to the conductive surfaces of the present invention.

DETAILED DESCRIPTION OF THE PREFERRED EMBODIMENT

Figure 1A:
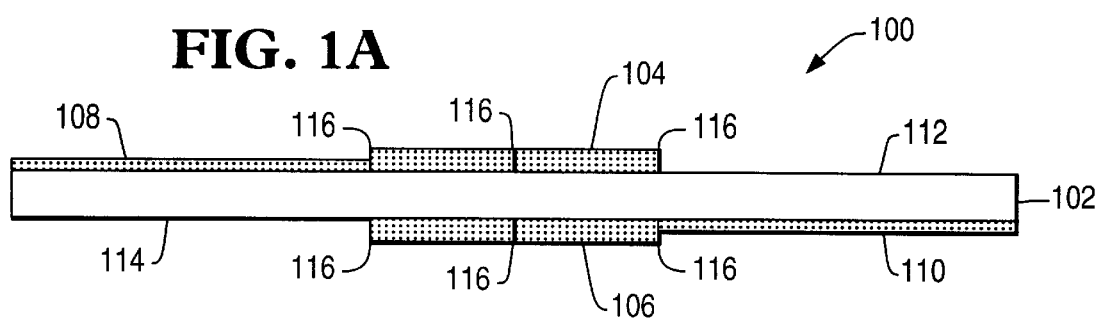
FIGS. 1A, 1B, and 1C are orthogonal views of one embodiment of the present invention.
Figure 1B:
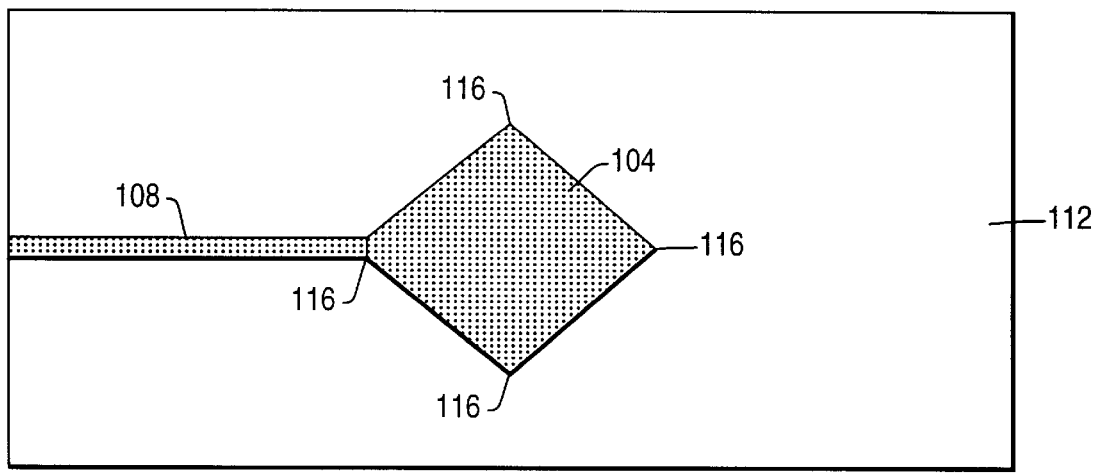
Figure 1C:
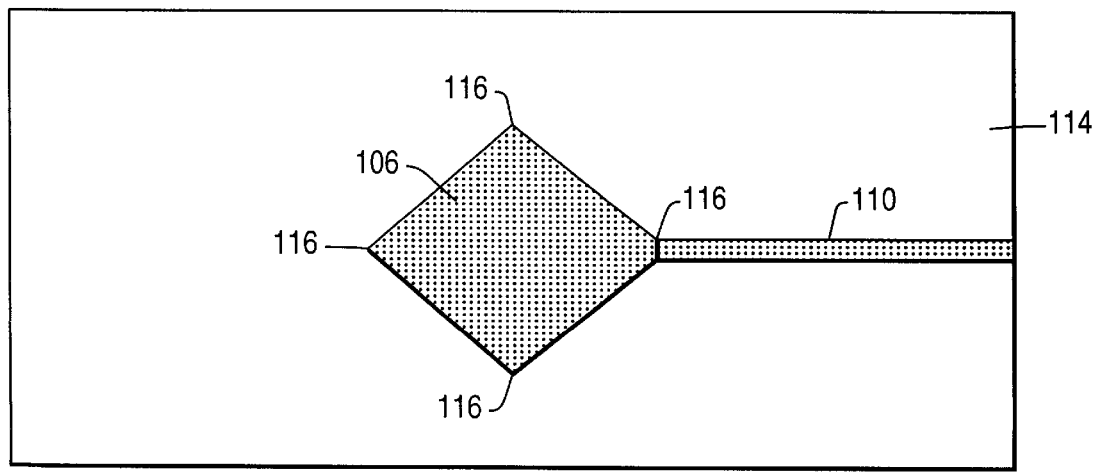

FIGS. 1A–1C are diagrams showing one embodiment of the present invention. FIG. 1A is a side view showing a capacitor 100 formed by an insulative first PCB layer 102, with a first conductive surface 104 and a second conductive surface 106 aligningly arranged on oppositionally disposed sides of the first PCB layer 102. Typically, first layer 102 and the conductive surfaces formed thereon 104, 106 are substantially planar. To provide electrical communication with the associated circuits for DC isolation, a first conductive path 108 on a first side 112 is operatively coupled to the first conductive surface 104, and a second conductive path 110 on a second side 114 is operatively coupled to the second conductive surface 106. First conductive path 108 and second conductive path 110 can be formed on the first layer 102 using etching techniques, or may be spot soldered, or otherwise connected with other techniques. While the first conductive path 108 and second conductive path 110 are illustrated as disposed apart from one another, the location of conductive paths 108 and 110 need not be so disposed. For example, first conductive path 108 and second conductive path 110 may be disposed in an oppositional relationship similar to that of the first conductive surface 104 and the second conductive surface 106, so that only the first PCB layer 102 separates them. Similarly, the first conductive path 108 and the second conductive path 110 could emerge from the first conductive surface 104 in an orthogonal relationship, such as would be the case if the second conductive path 108 were to emerge from the second conductive surface 106 away from the paper and toward the reader.

FIGS. 1B and 1C are diagrams showing a top and a bottom view of the embodiment of the invention discussed above with respect to FIG. 1A, illustrating the shape of the first conductive surface 104 in one embodiment of the invention. In the illustrated embodiment, the first conductive surface 104 is a polygonal shape comprising three or more vertices 116 about its periphery. First conductive path 108 is operatively coupled with the first conductive surface 108 at or near one of the plurality of vertexes 116, and second conductive path 110 is similarly operatively coupled with the second conductive surface 106 at or near one of the plurality of vertexes 116 of the second conductive surface 106. In one embodiment, the second conductive path 110 is coupled to a vertex 116 which is adjacent to the vertex to which the first conductive path 110 is coupled. In another embodiment, the second conductive path 110 is coupled to a different vertex 116. In either case, the polygonal shape of the first conductive surface 104 and the second conductive surface 106 and the attachment of the conductive paths 108, 110 to the vertices 116 of the polygonal conductive surfaces allows a smooth transition of current to flow across the conductive surfaces 104, 106 and develop charge between the two conductive surfaces 104, 106 without creating a large impedance distortion, thus reducing reflected waves, and improving performance of the capacitor 100.

In the illustrated embodiment, the first conducive surface 104 and the second conductive surface 106 are diamond-shaped trapezoids with four vertices 116, however, other embodiments also result in capacitor 100 performance benefits. For example, first conductive surface 104 and second conductive surface 106 could be square, triangular, hexagonal, or any polygonal shape symmetric about a polygonal axis. In any of these cases, capacitor performance is enhanced by assuring that the first conductive surface 104 and the second conductive surface 106 are aligningly disposed, that is, their vertices 116 are aligned relative to one another. Further improvements are possible where the first and second conductive surfaces 104 and 106 are substantially the same size and shape. For polygonal shaped conductive surfaces 104, 106 of higher order, such as hexagons and octagons, this allows the designer additional options in selecting the orientation of the second conductive path 110 relative to the first conductive path 108, while assuring that these paths are coupled to the vertices of the conductive surfaces 104, 106.

The present invention can be practiced in other embodiments as well. For example, the capacitor 100 can also be imbedded in a stripline configuration with conductive surfaces 104, 106, conductive paths 108, 110, and the insulative layer 102 so formed.

The areal size and separation of the first and second conductive surfaces 104, 106, and dielectric constant of the first layer 102 effect the performance parameters of the capacitor 100. In one embodiment, the first layer 102 is formed of FR-4 material with a dielectric constant of between approximately 4.0 to 4.5, and the areal size and separation of the first and second conductive surfaces 104, 106 are selected to achieve the desired capacitor 100 performance parameters. The first and second conductive surfaces 104, 106 can be formed of varying conductive materials, including copper.

Figure 2:
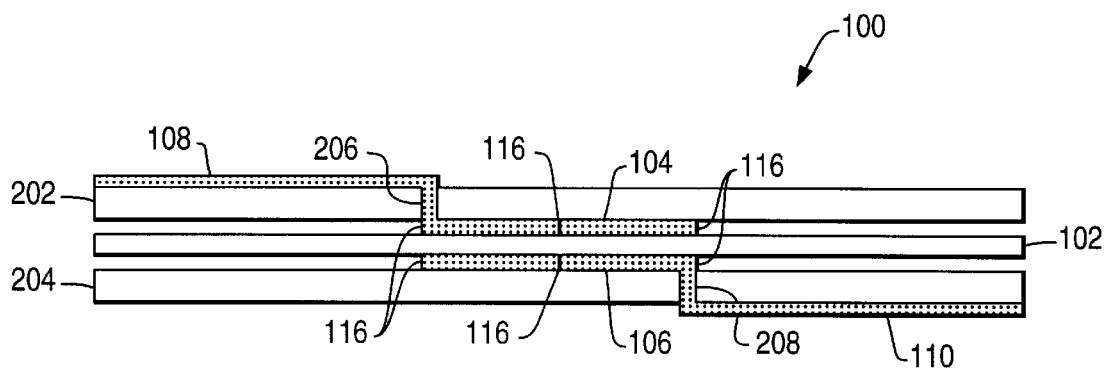
FIG. 2 is a side view of a second embodiment of the present invention employing a three layer PCB construction.

FIG. 2 is a diagram showing a side view of another embodiment of the present invention. This embodiment allows the capacitor 100 to be more easily implemented in a multi-layer board construction. In this embodiment, the first conductive path 108 and the second conductive path 110 are not formed on the first layer 102, but rather on a second layer 202 and third layer 204, respectively. In this embodiment, the capacitor 100 comprises a first layer 102 with a first conductive surface 104 and a second conductive surface 106, and the first layer 102 is disposed between a second layer 202 and a third layer 204. In this embodiment, the first conductive path 108 is disposed on the second layer 202 and the second conductive path 110 is disposed on the third layer 204. The second and third layers 202, 204 both include an first aperture or via 206 and a second aperture or via 208, respectively, which provides for electrical continuity between the first conductive surface 104 and the first conductive path 108 and the second conductive surface 106 and the second conductive path 110, respectively, through the first aperture 206 and the second aperture 208 at the vertices 116. One advantage of this embodiment of the invention, is that it allows the thickness of the first layer 102 to be selected for optimum capacitor characteristics in a multi-layer board configuration, while allowing the thickness of other layers to be selected in accordance with additional design considerations. While vias 206, 208 are illustrated as passing through second layer 202 and third layer 204, respectively, vias 206 and 208 may pass through the entire multilayer assembly, with suitable etching of the first and second conductive surfaces 104 and 106 such as described herein with respect to FIG. 6 to prevent electrical coupling between the conductive surfaces as desired.

Figure 3:
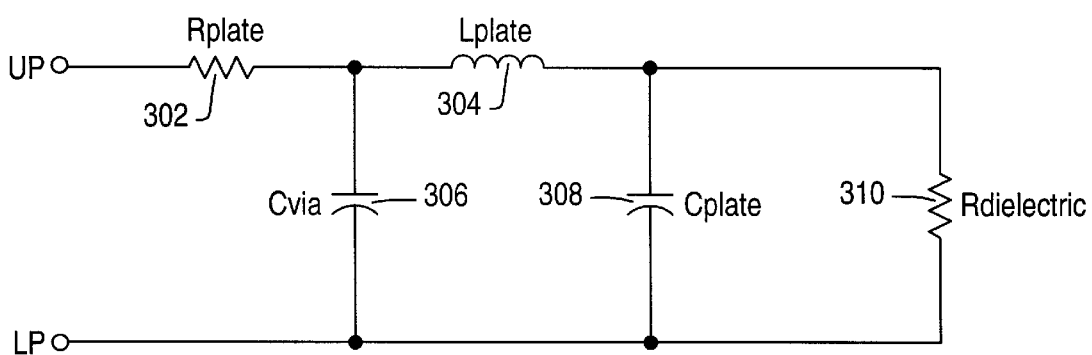
FIG. 3 is schematic diagram of the embodiment of the present invention shown in FIG. 2.

FIG. 3 is an equivalent circuit for the embodiment described in FIG. 2 and in the above text. In FIG. 3, $R_{dielectric}$ 310 refers to the resistance of the dielectric layer 102, $C_{via}$ 306 refers to capacitance of the aperture or via 206, 208, $C_{plate}$ 308 refers to the plate capacitance formed by the conductive surfaces 104, 106, $L_{plate}$ 304 refers to the inductance from conductive surfaces 104, 106, and $R_{plate}$ 302 refers to the resistance of the conductive surfaces 104, 106. The plate resistance can be calculated as:

$$R_{PLATE} = \frac{2l}{\sigma_C \delta b} \text{ where } \delta = \frac{1}{\sqrt{\pi f \mu \sigma_C}}$$

where $\sigma_c$ is the conductance of the conductive surfaces 104, 106 (typically copper), $\delta$ is the skin-depth of the conductive surfaces 104, 106, b is the plate width of the conductive surfaces, l is the plate length, f is the fundamental bit frequency (nominally approximately ½ of the bit rate) and $\mu$ is the permeability constant $\mu=3.19\times10^{-8}$ H/in. The plate inductance is determined from:

$$L_{PLATE} = \frac{\mu d}{b}$$

The capacitance of the parallel plate structure is determined by:

$$C = \frac{\varepsilon_O \varepsilon_r b^2}{d}$$

where $\epsilon_o=2.246\times10^{-13}$ F/in, $\epsilon_r=$the permittivity of the first layer 120, and d is the dielectric thickness of the first layer 120, or the distance between the first and second conductive surfaces 104, 106. The via capacitance is derived from empirically, and the dielectric resistance is typically very large and can be ignored.

The impedance of the circuit shown in FIG. 3 is derived with a few simplifying assumptions. Although the via capacitance can be determined empirically, it is in parallel with the plate capacitance and is about two orders of magnitude less, and it can therefore be ignored. In addition, the dielectric resistance is typically very large and can be neglected as well. With these assumptions, the impedance Z(jω) of the structure is as follows:

$$Z(j\omega) = L_{PLATE} \frac{\frac{1}{L_{PLATE}C} - \omega^2 + j\omega \frac{R_{PLATE}}{L_{PLATE}}}{j\omega}$$

The structure also has a resonant point where Z(jω) is at a minimum. This can be determined from $f_o = \frac{1}{2}\pi\sqrt{LC}$. To determine the impedance Z(jω) for a specific capacitor design, values for L, C, and R calculated from the physical parameters of the design using the foregoing equations, and substituted into the above equation. As an example, if $\epsilon_r=4.5$, b=0.4", d=0.002", were chosen, the resulting structure will have a capacitance of 80.9 pF, an inductance of 159 pH a resistance (DC+Skin-loss) of about 0.0016 Ω, and a resulting resonant frequency ($f_o$) of 1.4 GHz.

Figure 4:
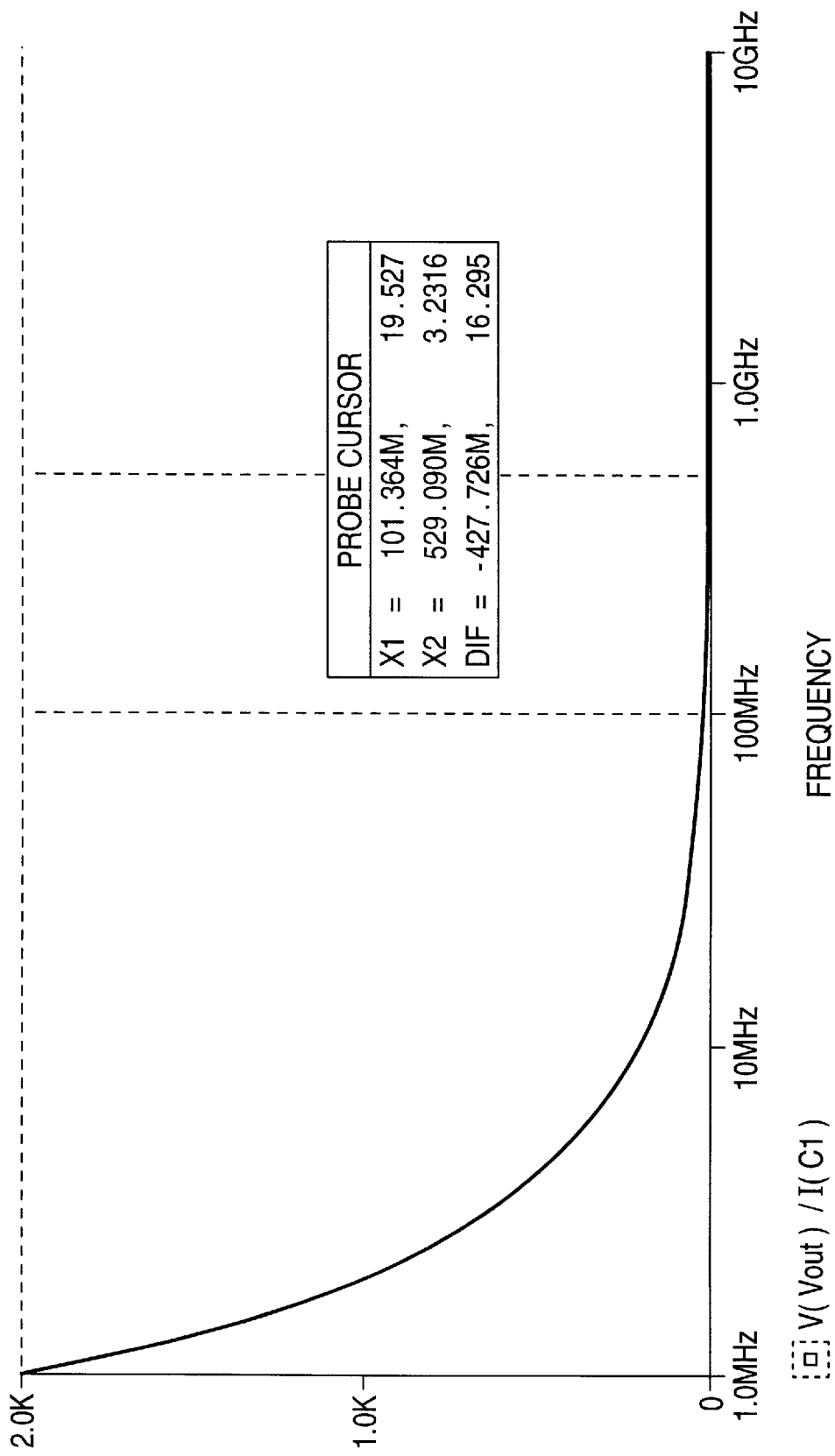
FIG. 4 is a plot of the impedance characteristics of one embodiment of the present invention.
Figure 5:
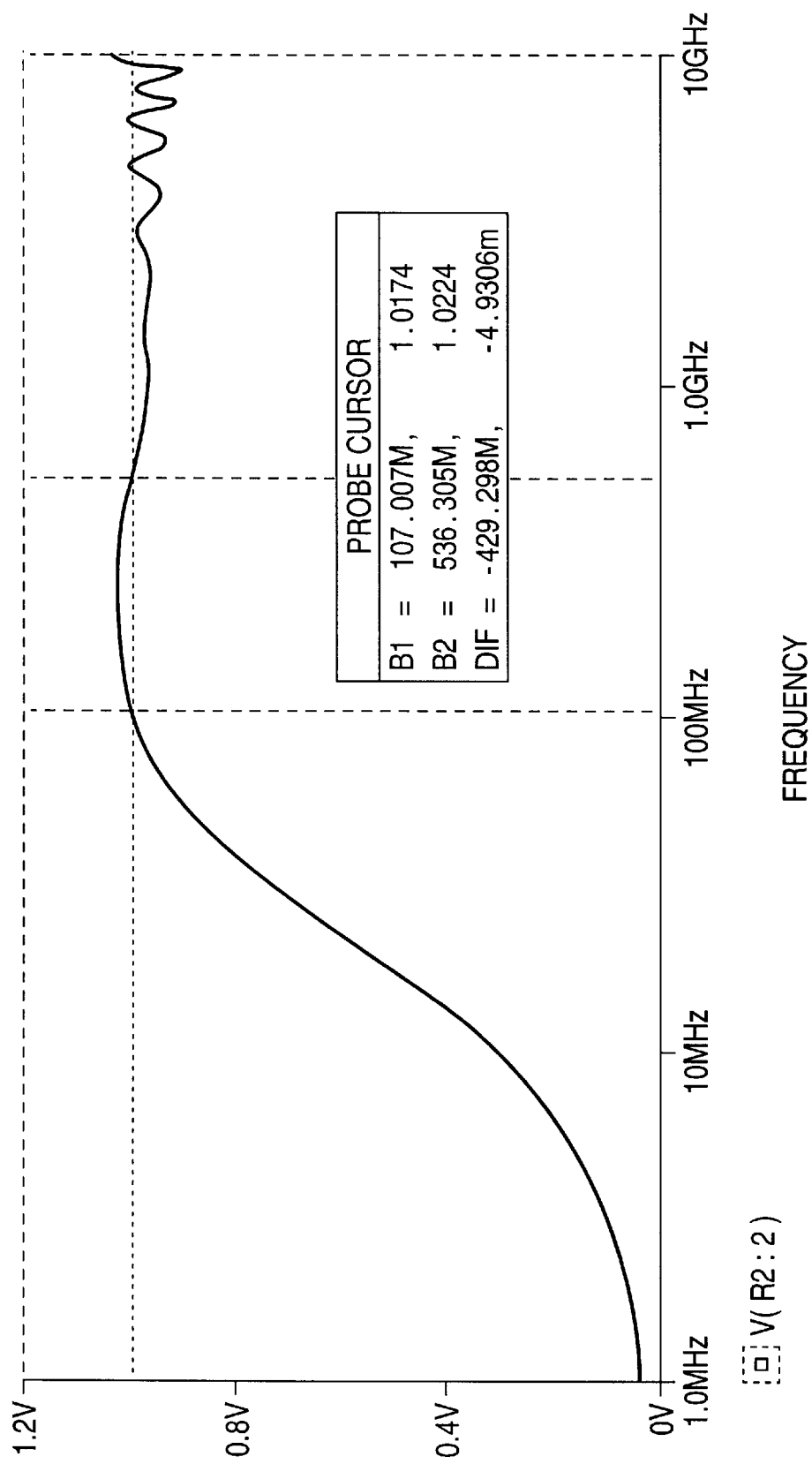
FIG. 5 is a plot of the transmissive characteristics of one embodiment of the present invention.

FIG. 4 shows the impedance of a capacitor with the aforementioned physical parameters. As shown in the figure, the impedance of the capacitor is approximately 20Ω at 100 MHz but only about 3Ω at 530 MHz. The effect of this impedance on a transmission line structure is shown in FIG. 5. Note that for higher frequencies (the frequencies of interest here), the capacitor has a relatively low impedance.

In one embodiment of the present invention, the innermost layers of a multi-layer configuration are used to implement the capacitor 100. This allows the two capacitor 100 layers to be kept as close as possible to one another to increase the capacitor value and thus the capacitance per unit area. However, care must be taken to assure that the next adjacent layers are not close enough to capacitively couple significantly to the layers adjacent the capacitor 100.

In some cases, it is best to implement the foregoing invention in the inner most layers of a multi-layer design. By doing so, the two capacitive layers can in most cases be kept as close as possible to each other which will increase the capacitor value and thus increase the capacitance per unit area. However, this causes a problem if the next adjacent layers are close enough to capacitively couple significantly to the layers adjacent to the capacitors. A multi-layered capacitor structure can alleviate this difficulty, but this solution would break up continuous ground and power planes on the board, since the capacitor plates are often fashioned from these planes. To minimize the coupling and to keep the planes continuous, a lattice structure can be used in the planes above and below the capacitor planes. The effect of such a design is to minimize capacitive coupling but keep the planes as contiguous as possible.

Figure 6:
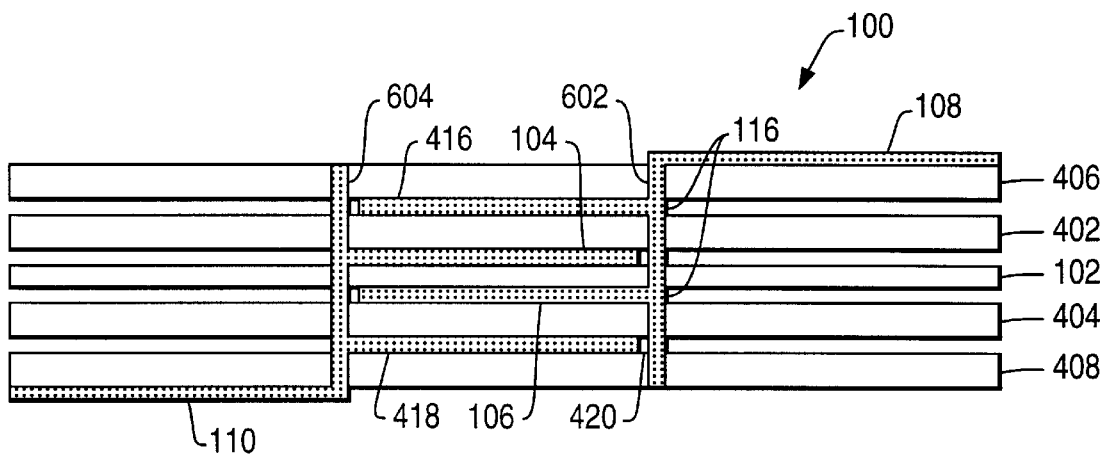
FIG. 6 is a side view of a third embodiment of the present invention employing multiple capacitor plates in a multi-layered construction.

FIG. 6 is a diagram presenting a side view of one example of a multi-layer embodiment of the present invention. In this embodiment, the capacitor 100 comprises a first layer 102, a second layer 402, a third layer 404, a fourth layer 406, and a fifth layer 408. A first via 602 extends through the multi-layer board, and is electrically coupled to the first conductive path 108. A second via 604 also extends through the multi-layer board, and is electrically coupled to the second conductive path 110. First via 602 also electrically couples a third conductive surface 416 and the second conductive surface 106, and second via 604 also electrically couples a fourth conductive surface 418 and the first conductive surface 104 at their respective vertices 116. Third conductive surface 416 and second conductive surface 106 are etched so that they do not electrically couple with second via 604, and the first conductive surface 104 and the fourth conductive surface 418 are etched so as not to electrically couple with first via 602. The alignignly arranged conductive surfaces 416, 104, 106, and 418 results in a four plate capacitor structure that allows for increased capacitance in smaller areas. Using the foregoing teaching, capacitors with additional plates and higher capacitance can be constructed in multi-layer boards. Also, using the vias 604, 602 or other suitable means, first conductive path 108 and second conductive path 110 can be disposed on any surface of any layer on the multi-layer board described.

Figure 7:
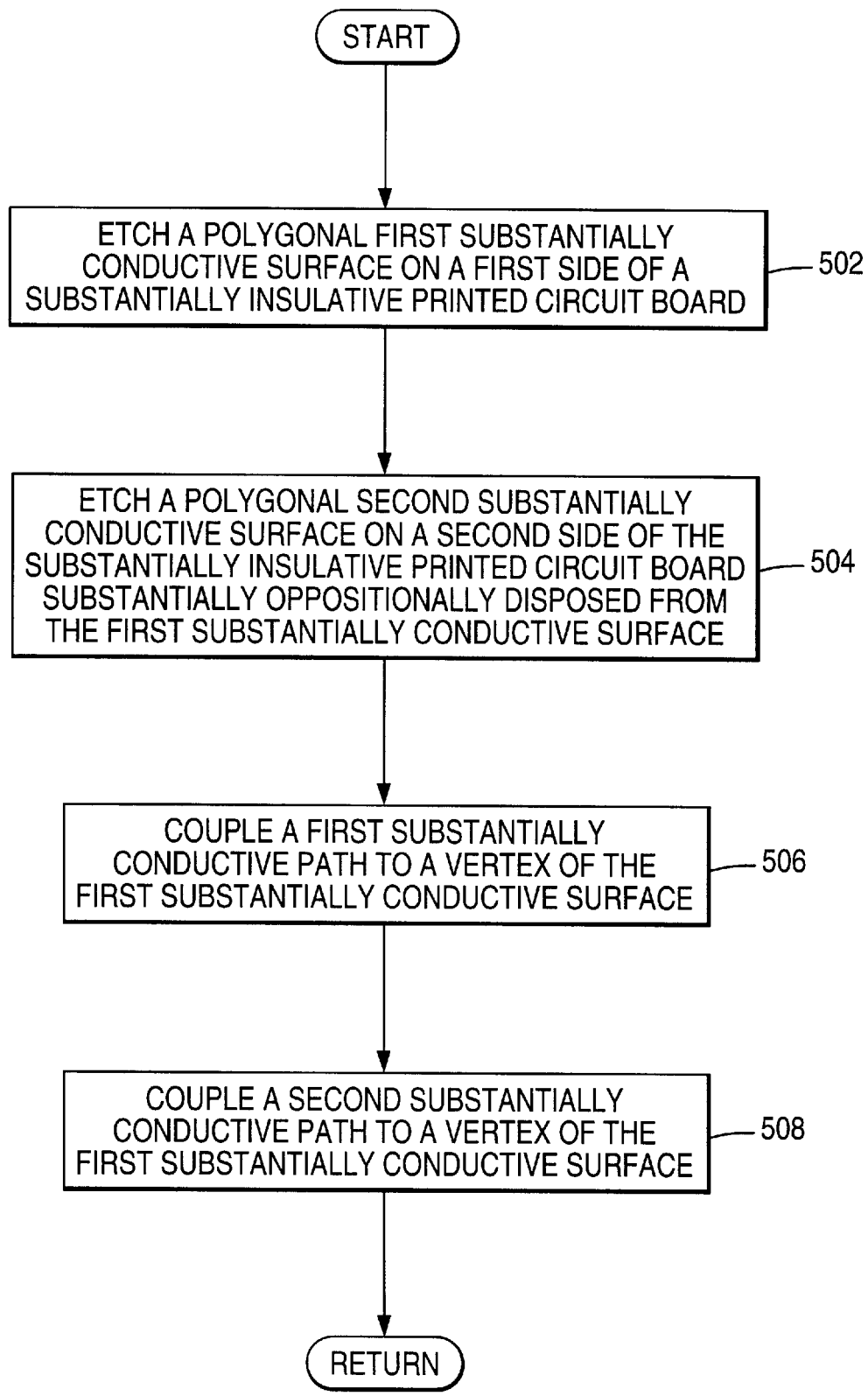
FIG. 7 is a flow chart illustrating representative method steps used in producing the capacitor of the present invention.

FIG. 7 is a flow chart depicting the method steps used to practice one embodiment of the present invention. The process begins by etching 502 a polygonal first substantially conductive surface 104 on a first side of a substantially insulative printed circuit board layer 102. The substantially insulative first layer 102 is selected to have the proper permittivity characteristics so that the capacitor 100 can be formed with a suitably thick first layer 102 and an acceptable conductive surface size. Next, a polygonal second substantially conductive surface 106 is etched 504 on a second side of the printed circuit board layer 102, in a position which is substantially in opposition to that of the first conductive surface 104. Next, a first substantially conductive path is coupled 506 to a vertex of the first substantially conductive surface, and a second substantially conductive path is coupled 508 to a vertex of the second substantially conductive surface.

Figure 8:
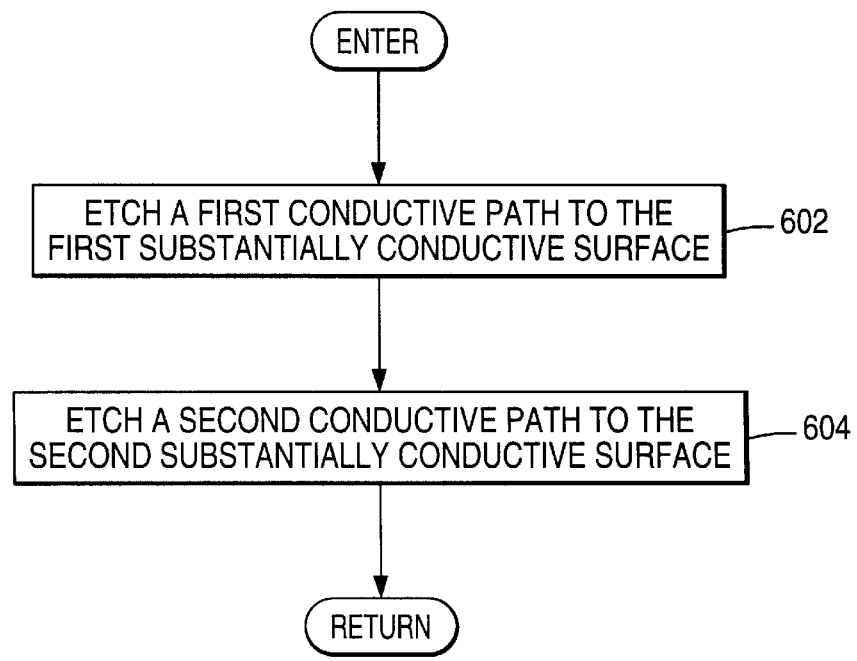
FIG. 8 is a flow chart illustrating representative method steps used in coupling conductive paths to the conductive surfaces of the present invention.

FIG. 8 is a flow chart illustrating the method steps used to perform the steps of coupling the conductive paths to the conductive surfaces in another embodiment of the present invention. In this embodiment, the first conductive path 108 is coupled to the first substantially conductive surface 104 by etching 602 an electrical trace to create a path on the first layer 102. Similarly, the second conductive path 110 is coupled by etching 604 an electrical trace to create a second conductive path to the second substantially conductive surface.

FIG. 9 is a flow chart illustrating the method steps used to perform the steps of coupling the conductive paths to the conductive surfaces in another embodiment of the present invention. In this embodiment, a substantially insulative printed circuit board layer having a first via 206 therethrough is affixed 702 to a first side of the first layer 102 adjacent to a vertex of the first substantially conductive surface. Then, a substantially insulative printed circuit board third layer with a second via 208 therethrough is affixed 704 to a second side of the first layer. The printed circuit board second layer is etched 706 to form the first substantially conductive path to the first via 206 in the third layer. Similarly, the printed circuit board third layer is also etched 708 to form the second substantially conductive path to the second via 208.

Figure 10:
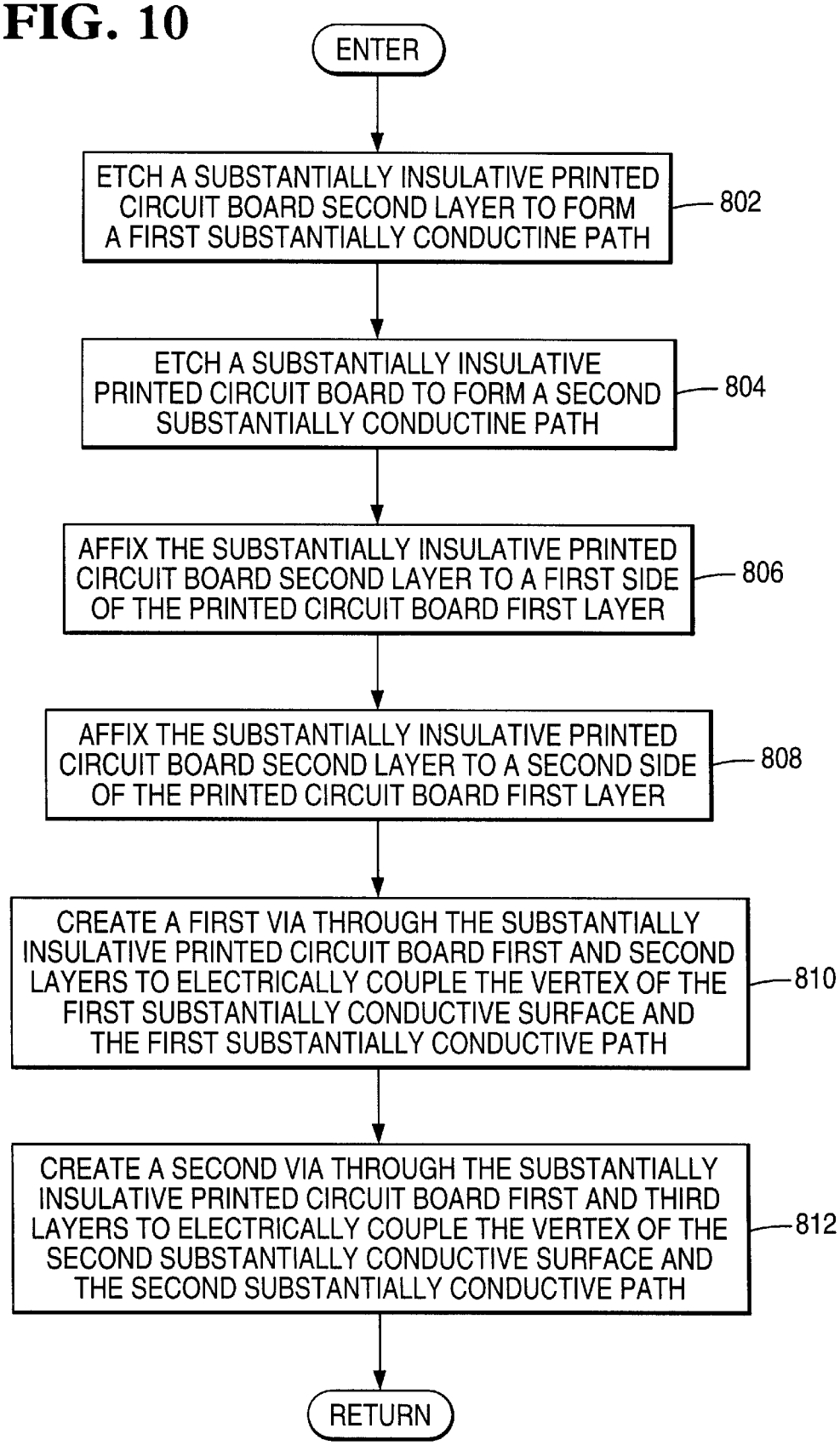
FIG. 10 is a flow chart illustrating other representative method steps used in an embodiment of the present invention to couple the conductive paths to the conductive surfaces of the present invention.

FIG. 10 presents a flow chart showing other method steps used to perform the step of coupling the first and second substantially conductive paths 108, 110 to their respective first and second conductive surfaces 104, 106 at the vertices 116. First, the substantially insulative printed circuit board second layer 202 is etched 802 to form the first substantially conductive path 108. Then, the substantially insulative printed circuit board third layer 204 is etched 804 to form the second substantially conductive path 110. Then, the second layer 202 is affixed 806 to a first side of the first layer 102, and the third layer 204 is affixed 808 to a second side of the first layer 102. Next, a first via is created 810 through the substantially insulative printed circuit board first, second, and third layers 102, 202, 204 to electrically couple the vertex 116 of the first substantially conductive surface 104 and the first substantially conductive path 108. Finally, a second via is created 812 through the substantially insulative printed circuit board first, second, and third layers 102, 202, 204 to electrically couple the vertex 116 of the second substantially conductive surface 106 with the second substantially conductive path 110.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

CONCLUSION

This concludes the description of the preferred embodiment of the invention. In summary, the present invention provides a compact capacitor that can be easily implemented on printed wiring boards or microstrip striplines in high speed applications without creating routing problems or substantial impedance mismatches or distortions. The capacitor comprises a substantially insulative printed circuit board first layer having a first side and a second side, a first substantially conductive surface disposed on the first side of the substantially insulative printed circuit board first layer, and a second substantially conductive surface substantially oppositionally disposed from the first substantially conductive surface on the second side of the substantially insulative printed circuit board first layer. The present invention also discloses a method of producing the PCB capacitor, comprising the steps of etching a first substantially conductive surface of trapezoidal shape on a first side of a substantially insulative printed circuit board, etching a second substantially conductive surface of trapezoidal shape on a second side of the substantially insulative printed circuit board, and electrically coupling a first substantially conductive path to an vertex of the first substantially conductive surface and a second substantially conductive path to a vertex of the second substantially conductive surface.

What is claimed is:

1. A capacitor, comprising:
    a substantially insulative printed circuit board first layer having a first side and a second side;
    a first substantially conductive surface disposed on the first side of the substantially insulative printed circuit board first layer;
    a second substantially conductive surface substantially oppositionally disposed from the first substantially conductive surface on the second side of the substantially insulative printed circuit board first layer; and
    wherein the first and second conductive surfaces arc substantially polygonal in shape.

2. The capacitor of claim 1, further comprising a first substantially conductive path coupled to the first substantially conductive surface at a vertex of the first substantially conductive surface and a second substantially conductive path coupled to a vertex of the second substantially conductive surface.

3. The capacitor of claim 1, wherein the substantially polygonal conductive surface is trapezoidally-shaped.

4. The capacitor of claim 1, wherein the substantially polygonal conductive surfaces are diamond-shaped.

5. The capacitor of claim 1, wherein the substantially polygonal conductive surfaces are square-shaped.

6. The capacitor of claim 1, wherein the substantially polygonal conductive surfaces are formed of copper.

7. The capacitor of claim 1, wherein the trapezoidal shape of the first and second conductive surfaces are substantially symmetric about a trapezoid axis.

8. The capacitor of claim 1, further comprising:
    a substantially insulative printed circuit board second layer having a first aperture therethrough, and a substantially insulative printed circuit board third layer having a second aperture therethrough, wherein first layer is disposed between the second layer and the third layer;
    a first conductive path electrically coupled to the first conductive surface via the first aperture; and
    a second conductive path electrically coupled to the first conductive surface via the second aperture.

9. The capacitor of claim 8, wherein the first conductive path is an electrical trace on a surface of the second layer, and the second conductive path is an electrical trace on a surface of the third layer.

10. The capacitor of claim 1, further comprising:
    a substantially insulative printed circuit board second layer;
    a substantially insulative printed circuit board third layer;
    a substantially insulative printed circuit board fourth layer;
    a substantially insulative printed circuit board fifth layer;
    a third conductive surface disposed between the fourth layer and the second layer and electrically coupled to the second conductive surface;
    a fourth conductive surface disposed between the third layer and the fifth layer and electrically coupled to the first conductive surface;
    wherein the third and fourth conductive surfaces are substantially polygonal in shape and are aligningly disposed in relation to the third and the first and the second conductive surfaces;
    a first conductive path electrically coupled to the third and the second conductive surfaces; and
    a second conductive path electrically coupled to the first and the fourth conductive surfaces.

11. The capacitor of claim 10, wherein the third conductive surface, the third conductive surface, the second conductive surface, and the first conductive path are electrically coupled by a first via through the substantially insulative printed circuit board first, second, third, fourth, and fifth layers, and the first conductive surface, the fourth conductive surface and the second conductive path are electrically coupled by a first via through the substantially insulative printed circuit board first, second, third, fourth, and fifth layers.

12. The capacitor of claim 11, wherein the third conductive surface is disposed on the second layer.

13. The capacitor of claim 11, wherein the third conductive surface is disposed on the fourth layer.

14. The capacitor of claim 1, wherein the substantially insulative material has a dielectric constant of between approximately 4.0 and 4.5.

15. A capacitor, comprising:
    a substantially insulative printed circuit board first layer having a first side and a second side;
    a first substantially conductive surface disposed on the first side of the printed circuit board;
    a second substantially conductive surface disposed on the second side of the printed circuit board; and
    wherein the first and second substantially conductive surfaces are of substantially the same size and shape and are in a substantially opposed relation.

16. The capacitor of claim 15, further comprising a first substantially conductive path coupled to a vertex of the first substantially conductive surface and a second substantially conductive path coupled to a vertex of the second substantially conductive surface.

17. A method of producing a capacitor, comprising the steps of:

etching a first substantially conductive surface on a first side of a substantially insulative printed circuit board, the first substantially conductive surface being substantially polygonal in shape;

etching a second substantially conductive surface on a second side of the substantially insulative printed circuit board in a position substantially oppositionally disposed from the first substantially conductive surface, the second substantially conductive surface being substantially polygonal in shape; and electrically coupling a first substantially conductive path to a vertex of the first substantially conductive surface, and electrically coupling a second substantially conductive path to a vertex of the second substantially conductive surface.

18. The method of claim 17, wherein the step of electrically coupling the first substantially conductive path to a vertex of the first substantially conductive surface comprises the step of etching a first conductive path to the first substantially conductive surface, and the step of electrically coupling the second substantially conductive path to a vertex of the second substantially conductive surface comprises the step of etching a second conductive path to the second substantially conductive surface.

19. The method of claim 17, wherein the step of electrically coupling a first substantially conductive path to a vertex of the first substantially conductive surface and electrically coupling a second substantially conductive path to a vertex of the second substantially conductive surface comprises the steps of:

affixing a substantially insulative printed circuit board second layer having a first via therethrough to a first side of the printed circuit board first layer, wherein the first via is disposed adjacent to a vertex of the first substantially conductive surface, and etching the printed circuit board second layer to form the first substantially conductive path to the first via; and affixing a substantially insulative printed circuit board third layer having a second via therethrough to a second side of the printed circuit board first layer, wherein the second via is disposed adjacent to a vertex of the second substantially conductive surface, and etching the printed circuit board third layer to form the second substantially conductive path to the second via.

20. The method of claim 17, wherein the step of electrically coupling a first substantially conductive path to a vertex of the first substantially conductive surface and electrically coupling a substantially conductive path to a vertex of the second conductive surface comprises the steps of:

etching a substantially insulative printed circuit board second layer to form a first substantially conductive path;

etching a substantially insulative printed circuit board third layer to form a second substantially conductive path;

affixing the substantially insulative printed circuit board second layer to a first side of the printed circuit board first layer;

affixing the substantially insulative printed circuit board third layer to a second side of the printed circuit board first layer;

creating a first via through the substantially insulative printed circuit board first and second layers to electrically couple the vertex of the first substantially conductive surface and the first substantially conductive path; and creating a second via through the substantially insulative printed circuit board first and third layers to electrically couple the vertex of the second substantially conductive surface and the second substantially conductive path.

21. A capacitor, formed by performing the steps of:

etching a first substantially conductive surface on a first side of a substantially insulative printed circuit board, the first substantially conductive surface being substantially polygonal in shape;

etching a second substantially conductive surface on a second side of the substantially insulative printed circuit board in a position substantially oppositionally disposed from the first substantially conductive surface, the second substantially conductive surface being substantially polygonal in shape;

electrically coupling a first substantially conductive path to a vertex of the first substantially conductive surface; and electrically coupling a second substantially conductive path to a vertex of the second substantially conductive surface.

22. The capacitor of claim 21, wherein the step of electrically coupling the first substantially conductive path to a vertex of the first substantially conductive surface comprises the step of etching a first conductive path to the first substantially conductive surface, and the step of electrically coupling the second substantially conductive path to a vertex of the second substantially conductive surface comprises the step of etching a second conductive path to the second substantially conductive surface.

23. The capacitor of claim 21, wherein the step of electrically coupling a first substantially conductive path to a vertex of the first substantially conductive surface comprises the steps of:

affixing a substantially insulative printed circuit board second layer having a first via therethrough to a first side of the printed circuit board first layer, wherein the first via is disposed adjacent to the vertex of the first substantially conductive surface;

affixing a substantially insulative printed circuit board third layer having a second via therethrough to a second side of the printed circuit board first layer, wherein the second via is disposed adjacent to the vertex of the second substantially conductive surface;

etching the printed circuit board second layer to form the first substantially conductive path to the first via; and etching the printed circuit board third layer to form the first substantially conductive path to the second via.

* * * * *